(12) United States Patent
Su

(10) Patent No.: US 9,609,792 B2
(45) Date of Patent: Mar. 28, 2017

(54) ELECTROMAGNETIC WAVE SHIELDING FILM AND METHOD FOR PRODUCING A CIRCUIT BOARD COMPRISING THE SHIELDING FILM

(71) Applicant: Guangzhou Fang Bang Electronics Co., Ltd., Guangzhou (CN)

(72) Inventor: Zhi Su, Guangzhou (CN)

(73) Assignee: GUANGZHOU FANG BANG ELECTRONICS CO., LTD., Guangzhou (CN)

( * ) Notice: Subject to any disclaimer, the term of this patent is extended or adjusted under 35 U.S.C. 154(b) by 0 days.

(21) Appl. No.: 14/482,674

(22) Filed: Sep. 10, 2014

(65) Prior Publication Data

US 2015/0201535 A1    Jul. 16, 2015

(30) Foreign Application Priority Data

Jan. 14, 2014 (CN) .......................... 2014 1 0016769

(51) Int. Cl.
*H05K 9/00* (2006.01)
*H05K 1/02* (2006.01)

(52) U.S. Cl.
CPC ......... *H05K 9/0084* (2013.01); *H05K 1/0215* (2013.01); *H05K 1/0216* (2013.01);
(Continued)

(58) Field of Classification Search
CPC ..................... H05K 9/0084; H05K 2201/0715
See application file for complete search history.

(56) References Cited

U.S. PATENT DOCUMENTS

| | | | |
|---|---|---|---|
| 6,496,334 B1 * | 12/2002 | Pang ...................... | B82Y 10/00 360/319 |
| 8,158,097 B2 | 4/2012 | DiTommaso et al. | |

(Continued)

*Primary Examiner* — Hung V Ngo
(74) *Attorney, Agent, or Firm* — Bond, Schoeneck & King, PLLC; William Greener; Jonathan Gray

(57) ABSTRACT

The present invention discloses an electromagnetic wave shielding film, comprising at least one electromagnetic shielding layer. A printed circuit board comprising the shielding film, is formed by tightly connecting the electromagnetic wave shielding film with the printed circuit board in the direction of thickness, wherein a ground layer is disposed on said printed circuit board. A method for producing the circuit board, including the following steps: (1) hot-pressing and curing the electromagnetic shielding film with the circuit board in the direction of thickness; (2) piercing the adhesive film layer by a rough surface of the electromagnetic shielding layer, to achieve grounding. Or, including the following steps: (1) hot-pressing and curing the electromagnetic shielding film with the circuit board in the direction of thickness; (2) piercing the shielding film by an electrically conductive substance, to achieve grounding. Or, including the following steps: (1) hot-pressing and curing the electromagnetic shielding film with the circuit board in the direction of thickness; (2) forming through holes or blind holes in the circuit board; (3) metallizing the holes, to achieve grounding. The adhesive film layer of the shielding film of the present invention contains no conductive particle, so that the cost and the insertion loss are reduced, and the development demand of high-speed and high-frequency of the electronic products is met.

9 Claims, 5 Drawing Sheets

(52) U.S. Cl.
CPC ........ *H05K 2201/0382* (2013.01); *H05K 2201/0715* (2013.01); *H05K 2201/10234* (2013.01); *H05K 2203/1189* (2013.01); *Y10T 156/1054* (2015.01); *Y10T 156/1057* (2015.01); *Y10T 156/1082* (2015.01)

(56) References Cited

U.S. PATENT DOCUMENTS

| | | | |
|---|---|---|---|
| 2010/0224402 A1* | 9/2010 | Lim | G06K 19/07327 174/388 |
| 2010/0294559 A1* | 11/2010 | Izawa | H05K 9/0024 174/378 |
| 2013/0206315 A1* | 8/2013 | Chung | H05K 9/0088 156/60 |
| 2013/0306364 A1* | 11/2013 | Suzuki | H05K 9/0088 174/394 |
| 2014/0093722 A1* | 4/2014 | Sung | H05K 9/0088 428/336 |
| 2015/0030878 A1* | 1/2015 | Zhi | H05K 9/0088 428/650 |
| 2015/0305144 A1* | 10/2015 | Tajima | B32B 7/02 174/350 |

\* cited by examiner

ELECTROMAGNETIC WAVE SHIELDING FILM AND METHOD FOR PRODUCING A CIRCUIT BOARD COMPRISING THE SHIELDING FILM

TECHNICAL FIELD

The present invention relates to an electromagnetic wave shielding film and a method for producing a circuit board comprising the shielding film.

BACKGROUND OF THE INVENTION

With rapid development of electronic industry, the electronic products is further developing towards miniaturization, light-weighting, and high density packing, this greatly promotes the development of a flexible circuit board, in order to achieve integration of elements with wire coupling. The flexible circuit board may be widely used in mobile phone, liquid crystal display, and the field of communication, aerospace, and other industries.

Under promotion by the international market, a functional flexible circuit board is a major part of the flexible circuit board market, and one important index of the functional flexible circuit board is electromagnetic shielding (EMI Shielding). With the functional integration of mobile phone and other communication devices, the components rapidly become to be of higher frequency and higher speed. For example, for the function of the mobile phone, in addition to the original audio transmission function, a photographying function has become an essential function, and WLAN, GPS and internet function have been popularized, along with the integration of sensing elements in the future, the rapid tendency of high-frequency and high-speed of the components is more inevitable. An electromagnetic interference inside or outside the components caused by high-frequency and high-speed as well as signal attenuation, namely insertion loss, during transmission and jitter will gradually become serious.

At present, the shielding film for the circuit board mainly has the following types of structure:

(1) a metal layer is formed on the insulating layer surface, and a conductive adhesive layer is formed on a surface of the metal layer;

(2) a conductive adhesive layer is formed on the surface of a metal layer; There is no essential difference between the structure (1) and (2), and in structure (2) merely no insulating layer is formed on the surface of the metal layer.

(3) an all-direction conductive adhesive layer is formed on the surface of the insulating layer.

The above types of structure may be subdivided to many different structures. For instance, an isolation layer is formed between the metal layers on the basis of the thickness of the metal layers, the number of the metal layers, the pattern of the metal layer (grid or chessboard), forming method of the metal layers and special demand. The shielding film has many structures on the basis of type of the conductive adhesive, type of the conductive particles. However, all the above-described structures have a conductive adhesive layer, and the conductive adhesive layer increases an insertion loss of the circuit board. Meanwhile the conductive metal particles decrease the bending property of the circuit board. Although structure (3) has no metal layer, but the shielding effectiveness is bad, and the insertion loss is great.

The metal layer of the shielding film of the present invention is extremely thin, its thickness is 0.1 to 6 microns, and the bending property of the circuit board can be improved. Meanwhile high shielding effectiveness and low insertion loss can be achieved. Because the conductive particles in the conductive adhesive may increase the insertion loss, the adhesive film layer of the present invention contains no conductive particle, and the grounding is achieved by pressing a novel electromagnetic wave shielding film tightly onto the circuit board in the following manner respectively:

(1) piercing the adhesive film layer by a rough surface of the electromagnetic shielding layer of the shielding film, and connecting with a ground layer of the circuit board, in order to achieve grounding.

(2) piercing the whole electromagnetic shielding film by an electrically conductive substance, and connecting with the ground layer of the circuit board, in order to achieve grounding.

(3) by a mechanical or laser drilling method for circuit board, forming through holes or blind holes on the circuit board comprising the shielding film; and connecting the metal shielding layer with the ground layer of the circuit board by metallizing the holes, to achieve grounding.

SUMMARY OF THE INVENTION

An object of the present invention is to provide the electromagnetic wave shielding film and a method for producing the circuit board comprising the shielding film.

The technical solution adopted by the present invention is:

An electromagnetic wave shielding film, comprising at least one electromagnetic shielding layer.

One side of said electromagnetic shielding layer is an insulating layer, and the other side is an adhesive film layer.

The thickness of said electromagnetic shielding layer is 0.1 to 6 microns; the material of said electromagnetic shielding layer is one of metallic material, ferrite, carbon nanotube; wherein, said metallic material is one of the following metal elements: aluminum, titanium, zinc, iron, nickel, chromium, cobalt, copper, silver, and gold, or said metallic material is an alloy formed from at least two of those metal elements; the thickness of said insulating layer is 1 to 25 microns; the insulating layer is one of a PPS film layer, a PEN film layer, polyester film layer, a polyimide film layer, a film layer formed after curing an epoxy resin ink, a film layer formed after curing of a polyurethane ink, a film layer formed after curing of a modified acrylic resin, a film layer formed after curing of a polyimide resin; the thickness of said adhesive film layer is 1 to 25 microns, the material used in the adhesive film layer is selected from following: modified epoxy resins, acrylics, modified rubbers, modified thermoplastic polyimides.

The surface of said electromagnetic shielding layer is flat; or, at least one surface is rough, its roughness is 0.3 to 5 microns.

A printed circuit board comprising a shielding film, is formed by tightly connecting the electromagnetic wave shielding film with the printed circuit board in the direction of thickness; wherein a ground layer is disposed in said printed circuit board.

A method for producing the circuit board comprising the shielding film, including the following steps:

(1) hot-pressing and curing the electromagnetic shielding film with the circuit board in the direction of thickness;

(2) using the electromagnetic shielding layer of which at least one surface is rough, piercing the adhesive film layer by the rough surface, such that at least a part of the rough surface is connected to the ground layer of the circuit board, in order to achieve grounding, thereby a product is obtained.

A method for producing the circuit board comprising the shielding film, including the following steps:

(1) hot-pressing and curing the electromagnetic shielding film with the circuit board in the direction of thickness;

(2) piercing the whole electromagnetic shielding film by the electrically conductive substance, and connecting with the ground layer of the circuit board, in order to achieve grounding, thereby the product is obtained.

A method for producing the circuit board comprising the shielding film, including the following steps:

(1) hot-pressing and curing the electromagnetic shielding film with the circuit board in the direction of thickness, to form the circuit board comprising the shielding film;

(2) by a mechanical or laser drilling method for circuit board, forming through holes or blind holes in the circuit board comprising the shielding film;

(3) metallizing the holes, such that the electromagnetic shielding layer of the electromagnetic shielding film is connected to the ground layer of the circuit board, to achieve grounding, thereby the product is obtained.

In step (2), said piercing the electromagnetic shielding film by the electrically conductive substance is piercing the whole shielding film by the conductive particles.

Said circuit board is one of one flexible sided, two flexible sided, multilayered, rigid-flex combined boards.

The beneficial effects of the present invention are: the adhesive film layer of the shielding film contains no conductive particle, so that the cost and the insertion loss can be reduced, and the development demand of high-speed and high-frequency of the electronic products can be met.

DESCRIPTION OF THE SPECIFIC EMBODIMENTS

Figure 1:
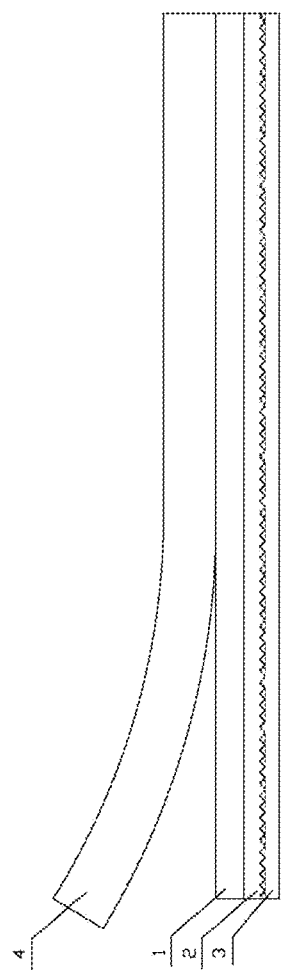
FIG. 1 is a structural schematic diagram of the electromagnetic wave shielding film according to the present invention.

An electromagnetic wave shielding film, comprising at least one electromagnetic shielding layer.

One side of said electromagnetic shielding layer is the insulating layer, and the other side is the adhesive film layer.

The thickness of said electromagnetic shielding layer is 0.1 to 6 microns. The material of said electromagnetic shielding layer is one of metallic material, ferrite, and carbon nanotube. Wherein, said metallic material is one of the following metal elements: aluminum, titanium, zinc, iron, nickel, chromium, cobalt, copper, silver, and gold. Or said metallic material is an alloy formed from at least two of those metal elements. The thickness of said insulating layer is 1 to 25 microns. The insulating layer is one of a PPS film layer, a PEN film layer, a polyester film layer, a polyimide film layer, a film layer formed after curing of an epoxy resin ink, a film layer formed after curing of a polyurethane ink, a film layer formed after curing of a modified acrylic resin, a film layer formed after curing of a polyimide resin. The thickness of said adhesive film layer is 1 to 25 microns, and the material used in the adhesive film layer is selected from following: modified epoxy resins, acrylics, modified rubbers, modified thermoplastic polyimides.

The surface of said electromagnetic shielding layer is flat; or, at least one surface is rough, its roughness is 0.3 to 5 microns.

A printed circuit board comprising a shielding film, is formed by tightly connecting the electromagnetic wave shielding film to the printed circuit board in the direction of thickness; wherein a ground layer is disposed in said printed circuit board.

A method for producing the circuit board comprising the shielding film, includes the following steps:

(1) hot-pressing and curing the electromagnetic shielding film with the circuit board in the direction of thickness;

(2) using an electromagnetic shielding layer of which at least one surface is rough, piercing the adhesive film layer by the rough surface, such that at least a part of the rough surface is connected to the ground layer of the circuit board, in order to achieve grounding, thereby the product is obtained.

A method for producing the circuit board comprising the shielding film, includes the following steps:

(1) hot-pressing and curing the electromagnetic shielding film with the circuit board in the direction of thickness;

(2) piercing the whole electromagnetic shielding film by the electrically conductive substance, and connecting with the ground layer of the circuit board, in order to achieve grounding, thereby the product is obtained.

A method for producing the circuit board comprising the shielding film, including the following steps:

(1) hot-pressing and curing the electromagnetic shielding film with the circuit board in the direction of thickness, to form the circuit board comprising the shielding film;

(2) by the mechanical or laser drilling method for circuit board, forming through holes or blind holes in the circuit board comprising the shielding film;

(3) metallizing the holes, such that the electromagnetic shielding layer of the electromagnetic shielding film is connected to the ground layer of the circuit board, to achieve grounding, thereby the product is obtained.

In step (2), said piercing the electromagnetic shielding film by the electrically conductive substance is piercing the whole shielding film by the conductive particles.

Said circuit board is one of one flexible sided, two flexible sided, multilayered, rigid-flex combined boards.

EXAMPLES

The present invention will be further explained in conjunction with the following specific examples:

Example 1

As shown in FIG. 1, in an electromagnetic wave shielding film for a printed circuit board, an insulating layer 1 is disposed on a carrier film 4, an electromagnetic shielding layer 2 is disposed on the insulating layer 1, an adhesive film layer 3 is disposed on the electromagnetic shielding layer 2, wherein the carrier film 4 is a PET release film, which may be peeled from the insulating layer 1.

The production method of the electromagnetic wave shielding film includes the following steps:

(1) forming the insulating layer 1 on the carrier film 4: selecting a PET release film with a thickness of 25 to 150 microns and a width of 100 mm to 1000 mm, and coating an ink onto one side of its release surface, the insulating layer 1 is formed after complete curing, said ink is an epoxy resin ink or a polyurethane ink, and the thickness is 1 to 25 microns, preferably 3 to 10 microns;

(2) forming the electromagnetic shielding layer 2 on the insulating layer 1: the material of the electromagnetic shielding layer is one of the following metal elements: nickel, chromium, copper, silver, and gold; or the material of the electromagnetic shielding layer is a nickel-chromium alloy or a copper-nickel alloy. Forming the electromagnetic shielding layer 2 on the insulating layer 1 by one of the following methods: chemical plating, PVD, CVD, evaporation coating, sputtering coating, electroplating, or combined process thereof;

(3) roughening the surface of the electromagnetic shielding layer 2: by the circuit board copper foil roughing method, roughening one surface of the electromagnetic shielding layer, followed by curing and passivation.

(4) coating one of the following substances onto the electromagnetic shielding layer 2: modified epoxy resin, modified acrylic resin, modified rubbers, modified thermoplastic polyimides; after evaporating the solvent by drying, the adhesive film layer 3 is formed;

wherein, after being roughened, the thickness of the electromagnetic shielding layer 2 is 0.1 to 6 microns, the roughness is 0.3 to 5 microns; preferably, the thickness of the electromagnetic shielding layer 2 is 0.2 to 5 microns, the roughness is 0.5 to 5 microns; the thickness of said insulating layer 1 is 1 to 25 microns, preferably 3 to 10 microns; the thickness of said adhesive film layer 3 is 1 to 25 microns, preferably 1 to 8 microns.

Example 2

As shown in FIG. 1, in an electromagnetic wave shielding film for the printed circuit board, the insulating layer 1 is disposed on the carrier film 4, an electromagnetic shielding layer 2 is disposed on the insulating layer 1, and the adhesive film layer 3 is disposed on the electromagnetic shielding layer 2, wherein, the carrier film is PET release film, which can be peeled from the insulating layer 1.

The production method of the electromagnetic wave shielding film includes the following steps:

(1) forming the insulating layer 1 on the carrier film 4: selecting a PET release film with a thickness of 25 to 150 microns and a width of 100 mm to 1000 mm, coating an ink onto one side of its release surface, the insulating layer 1 is formed after complete curing, said ink is an epoxy resin ink or a polyurethane ink, the thickness is 1 to 25 microns, preferably 3 to 10 microns;

(2) forming an electromagnetic shielding layer 2 on the insulating layer 1: the material of the electromagnetic shielding layer is one of the following metal elements: nickel, chromium, copper, silver, and gold; or the material of the electromagnetic shielding layer is a nickel-chromium alloy or a copper-nickel alloy. Forming the electromagnetic shielding layer 2 on the insulating layer 1 by one of the following methods: chemical plating, PVD, CVD, evaporation coating, sputtering coating, electroplating, or combined process thereof;

(3) roughening the surface of the electromagnetic shielding layer 2: roughening one surface of the electromagnetic shielding layer by a circuit board microetch method, followed by passivation;

(4) coating one of the following substances onto the electromagnetic shielding layer 2: modified epoxy resin, modified acrylic resin, modified rubbers, modified thermoplastic polyimides, and after evaporating the solvent by drying, the adhesive film layer 3 is formed;

wherein, after being roughened, the thickness of the electromagnetic shielding layer 2 is below 6 microns, the roughness is 0.3 to 5 microns; preferably, the thickness of the electromagnetic shielding layer 2 is 0.2 to 5 microns, the roughness is 0.5 to 5 microns; the thickness of said insulating layer 1 is 1 to 25 microns, preferably 3 to 10 microns; the thickness of said adhesive film layer 3 is 1 to 25 microns, preferably 1 to 8 microns.

Example 3

Figure 3:
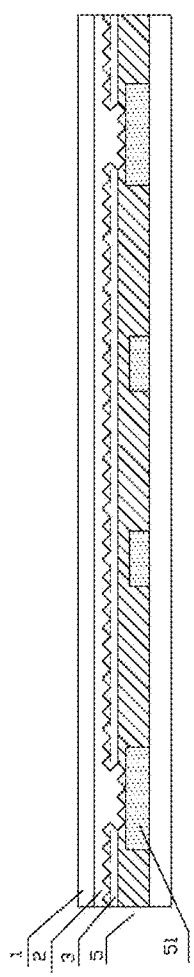
FIG. 3 is a structural schematic diagram of the circuit board using the above-described shielding film according to the present invention.

A circuit board using the electromagnetic wave shielding film having the layered structure of Example 1, its structure is as shown in FIG. 3. The electromagnetic wave shielding film is tightly connected to the printed circuit board 5 in the direction of thickness, the ground layer 51 is disposed in said printed circuit board, and a part of an electromagnetic shielding layer 2 is directly connected to the ground layer 51.

An electromagnetic shielding layer 2 is disposed on an insulating layer 1 of the electromagnetic wave shielding film. An adhesive film layer 3 is disposed on the electromagnetic shielding layer 2. One surface of the electromagnetic shielding layer 2 is rough, the thickness of the electromagnetic shielding layer 2 is 0.1 to 6 microns, and the roughness of the rough surface is 0.3 to 5 microns. Preferably, the thickness of the electromagnetic shielding layer 2 is 0.5 to 6 microns, and the surface roughness is 1.0 to 5 microns. The thickness of said adhesive film layer 3 is 1 to 25 microns, preferably 1 to 8 microns. The thickness of the insulating layer 1 is 1 to 25 microns, preferably 3 to 10 microns.

Figure 2:
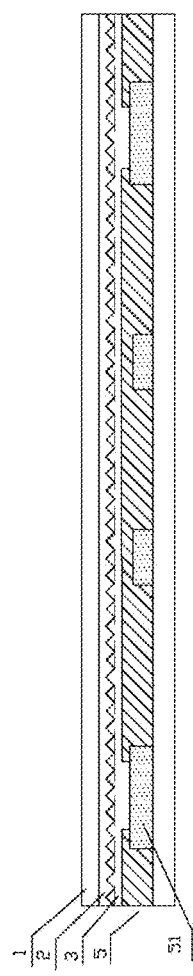
FIG. 2 is a structural schematic diagram of the circuit board using the above-described shielding film according to the present invention.

Correspondingly, a method for producing the circuit board by using the electromagnetic wave shielding film includes the following steps:

(1) as shown in FIG. 2, hot-pressing and curing the shielding film having the layered structure (produced by the method of Example 1) as shown in FIG. 1 with the circuit board in the direction of thickness, then curing it at 160° C. for 1 hour. When the material of the adhesive film layer 3 is the modified epoxy resin, the temperature and time of the hot-pressing and curing are 190° C. and 90 seconds respectively. When the material of the adhesive film layer 3 is the modified acrylic resin, the temperature and time of the hot-pressing and curing are 170° C. and 90 seconds respectively;

(2) as shown in FIG. 3, piercing the adhesive film layer 3 by a part of the rough surface of said electromagnetic shielding layer 2, and contacting with the ground layer of the circuit board, to achieve grounding.

Said adhesive film layer 3 contains no conductive particle, this avoids the situation that abundant electric charges accumulated due to the presence of the conductive particles in the adhesive film layer 3 cannot be discharged and thus the insertion loss of the circuit board is increased.

Example 4

Figure 4:
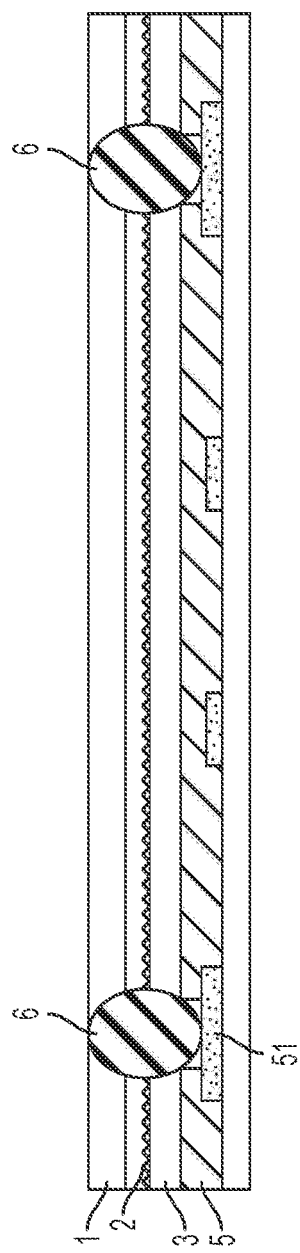
FIG. 4 is a structural schematic diagram of the circuit board using the above-described shielding film according to the present invention.

A circuit board using the electromagnetic wave shielding film having the layered structure of Example 1, its structure is as shown in FIG. 4. The electromagnetic wave shielding film is tightly connected to the printed circuit board 5 in the direction of thickness, and a ground layer 51 is disposed on said printed circuit board. an electromagnetic shielding layer 2 is disposed on the insulating layer 1 of the electromagnetic wave shielding film, an adhesive film layer 3 is disposed on the electromagnetic shielding layer 2, and the electromagnetic shielding layer 2 is connected to the ground layer 51 via conductive particles. The thickness of the electromagnetic shielding layer 2 is 0.1 to 6 microns. The thickness of said adhesive film layer 3 is 1 to 25 microns, preferably 1 to 8 microns. The thickness of the insulating layer 1 is 1 to 25 microns, preferably 3 to 10 microns.

Correspondingly, a method for producing the circuit board by using the electromagnetic wave shielding film includes the following steps:

(1) as shown in FIG. 2, hot-pressing and curing the shielding film having the layered structure (produced by the method of Example 1) as shown in FIG. 1 with the circuit board in the direction of thickness, then curing it at 160° C. for 1 hour. If the material of the adhesive film layer 3 is modified epoxy resin, the temperature and time of the hot-pressing and curing are 190° C. and 90 seconds respectively. If the material of the adhesive film layer 3 is the modified acrylic resin, the temperature and time of the hot-pressing and curing are 170° C. and 90 seconds respectively;

(2) as shown in FIG. 4, piercing the whole electromagnetic wave shielding film by conductive particles 6, which contact with the ground layer 51 of the circuit board, to achieve grounding.

Said adhesive film layer 3 contains no conductive particle, this can avoids the situation that abundant electric charges accumulated due to the presence of the conductive particles in the adhesive film layer 3 cannot be discharged and thus the insertion loss of the circuit board is increased.

Example 5

Figure 5:
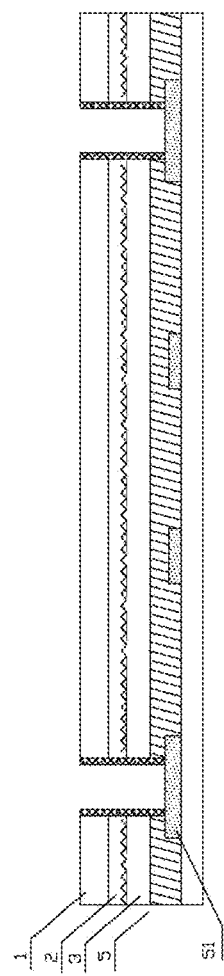
FIG. 5 is a structural schematic diagram of the circuit board using the above-described shielding film according to the present invention.

A circuit board using the electromagnetic wave shielding film having the layered structure of Example 1, its structure is as shown in FIG. 5. The electromagnetic wave shielding film is tightly connected to the printed circuit board 5 in the direction of thickness, and a ground layer 51 is disposed in said printed circuit board. an electromagnetic shielding layer 2 is disposed on the insulating layer 1 of electromagnetic wave shielding film, and an adhesive film layer 3 is disposed on the electromagnetic shielding layer 2. The electromagnetic shielding layer 2 is connected to the ground layer 51 of the printed circuit board 5 via the blind holes or through holes formed after metallizing. The thickness of the electromagnetic shielding layer 2 is 0.1 to 6 microns. The thickness of said adhesive film layer 3 is 1 to 10 microns. The thickness of said insulating layer 1 is 3 to 10 microns.

Correspondingly, a method for producing the circuit board by using the electromagnetic wave shielding film includes the following steps:

(1) As shown in FIG. 2, hot-pressing and curing the shielding film having the layered structure (produced by the method of Example 1) as showing in FIG. 1 with the circuit board in the direction of thickness, then curing it at 160° C. for 1 hour. If the material of the adhesive film layer 3 is modified epoxy resin, the temperature and time of the hot-pressing and curing are 190° C. and 90 seconds respectively. If the material of adhesive film layer 3 is modified acrylic resin, the temperature and time of the hot-pressing and curing are 170° C. and 90 seconds respectively;

(2) as shown in FIG. 5, using a mechanical or laser drilling method for circuit board, through holes or blind holes are formed on the circuit board comprising the shielding film;

(3) metallizing the holes, such that the electromagnetic shielding layer is connected to the ground layer of the circuit board, to achieve grounding; the metallizing of the holes adopts one of the following methods: chemical plating, PVD, CVD, evaporation coating, sputtering coating, electroplating, or combined process thereof.

Said adhesive film layer 3 contains no conductive particle, this can avoids the situation that abundant electric charges accumulated due to the presence of the conductive particles in the adhesive film layer 3 cannot be discharged and thus the insertion loss of the circuit board is increased. The adhesive film layer of the shielding film according to the present invention contains no conductive particle, so that the cost and the insertion loss are reduced, and the development demand of high-speed and high-frequency of the electronic products is met.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

I claim:

1. An electromagnetic wave shielding film, comprising at least one electromagnetic shielding layer having at least a first and second side, wherein an insulating layer is disposed on the first side of said electromagnetic shielding layer and an adhesive film layer is disposed on the second side of said electromagnetic shielding layer, wherein the adhesive film layer of the shielding film is nonconductive, and the second side of the electromagnetic shielding layer is characterized by a roughness sufficient to pierce the adhesive film layer.

2. The electromagnetic wave shielding film according to claim 1, wherein the thickness of said electromagnetic shielding layer is 0.1 to 6 microns; said electromagnetic shielding layer being comprised of one of a metallic material, ferrite, and carbon nanotubes; wherein said metallic material is one of the following metal elements: aluminum, titanium, zinc, iron, nickel, chromium, cobalt, copper, silver, and gold, or an alloy of at least two of those metal elements; wherein the thickness of said insulating layer is 1 to 25 microns; wherein the insulating layer is one of a PPS film layer, a PEN film layer, a polyester film layer, a polyimide film layer, a film layer formed after curing of an epoxy resin ink, a film layer formed after curing of a polyurethane ink, a film layer formed after curing of a modified acrylic resin, a film layer formed after curing of a polyimide resin; wherein the thickness of said adhesive film layer is 1 to 25 microns, and the material used in the adhesive film layer is selected from the following: a modified epoxy resin, an acrylic, a modified rubber, a modified thermoplastic polyimide.

3. The electromagnetic wave shielding film according to claim 2, wherein an opposing surface of said electromagnetic shielding layer is flat, and the roughness of the first side is 0.3 to 5 microns.

4. A printed circuit board assembly, comprising:
a printed circuit board having a ground layer on a surface thereof; and
an electromagnetic wave shielding film comprising
at least one electromagnetic shielding layer having at least a first and second side, wherein an insulating layer is disposed on the first side of said electromagnetic shielding layer and an adhesive film layer is disposed on the second side of said electromagnetic shielding layer, wherein the adhesive film layer of the shielding film is nonconductive, and the second side of the electromagnetic shielding layer is characterized by a roughness sufficient to pierce the adhesive film layer, wherein the electromagnetic wave shielding film is connected to the printed circuit board such that the electromagnetic shielding layer is in contact with the ground layer.

5. A method for producing a printed circuit board assembly, comprising:
providing an electromagnetic wave shielding film comprising at least one electromagnetic shielding layer having at least a first and second side, wherein an insulating layer is disposed on the first side of said electromagnetic shielding layer and an adhesive film layer is disposed on the second side of said electromagnetic shielding layer, wherein the adhesive film layer of the shielding film is nonconductive, and the second side of the electromagnetic shielding layer is characterized by a roughness sufficient to pierce the adhesive film layer;
providing a printed circuit board having a ground layer on a surface thereof;
hot-pressing and curing the electromagnetic wave shielding film with the circuit board in the direction of thickness; and
piercing the adhesive film layer with the rough surface, such that at least a part of the rough surface is in contact with the ground layer of the circuit board.

6. A method for producing a circuit board assembly, comprising:

providing an electromagnetic wave shielding film comprising at least one electromagnetic shielding layer having at least a first and second side, wherein an insulating layer is disposed on the first side of said electromagnetic shielding layer and an adhesive film layer is disposed on the second side of said electromagnetic shielding layer, wherein the adhesive film layer of the shielding film is nonconductive, and the second side of the electromagnetic shielding layer is characterized by a roughness sufficient to pierce the adhesive film layer;

providing a printed circuit board having a ground layer on a surface thereof;

hot-pressing and curing the electromagnetic shielding film with the circuit board in the direction of thickness;

piercing the whole electromagnetic shielding film by an electrically conductive substance, and connecting to the ground layer of the circuit board, in order to achieve grounding.

7. The method of claim 6, wherein said piercing the electromagnetic shielding film by the electrically conductive substance is by piercing the whole shielding film by conductive particles.

8. A method for producing a circuit board assembly, comprising:

providing an electromagnetic wave shielding film comprising at least one electromagnetic shielding layer having at least a first and second side, wherein an insulating layer is disposed on the first side of said electromagnetic shielding layer and an adhesive film layer is disposed on the second side of said electromagnetic shielding layer, wherein the adhesive film layer of the shielding film is nonconductive, and the second side of the electromagnetic shielding layer is characterized by a roughness sufficient to pierce the adhesive film layer;

providing a printed circuit board having a ground layer on a surface thereof;

hot-pressing and curing the electromagnetic shielding with the circuit board in the direction of thickness, to form the circuit board assembly;

forming through holes or blind holes in the circuit board comprising the shielding film by a mechanical or laser drilling method for circuit board;

metallizing the holes, such that the electromagnetic shielding layer of the electromagnetic shielding film is connected to the ground layer of the circuit board to achieve grounding.

9. The method of any one of claims 5, 6, or 8, characterized in that said circuit board is one of one flexible sided, two flexible sided, multilayered, and rigid-flex combined boards.

* * * * *